United States Patent
Hinton et al.

(10) Patent No.: US 11,626,889 B1
(45) Date of Patent: Apr. 11, 2023

(54) PARTIAL UPDATE SHARING IN JOINT LDPC DECODING AND ANCILLARY PROCESSORS

(71) Applicant: L3Harris Technologies, Inc., Melbourne, FL (US)

(72) Inventors: Ryan W. Hinton, Erda, UT (US); David G. Landon, Bountiful, UT (US); Joshua D. Gunn, Farmington, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 17/527,683

(22) Filed: Nov. 16, 2021

(51) Int. Cl.
*H03M 13/00* (2006.01)
*H03M 13/11* (2006.01)
*H03M 13/15* (2006.01)

(52) U.S. Cl.
CPC .... *H03M 13/1177* (2013.01); *H03M 13/1108* (2013.01); *H03M 13/152* (2013.01); *H03M 13/6331* (2013.01)

(58) Field of Classification Search
CPC ........... H03M 13/3746; H03M 13/255; H03M 13/1154; H03M 13/1191; H03M 13/1108; H03M 13/152; H03M 13/6331; H03M 13/1177; H03M 13/116; H03M 13/1165
See application file for complete search history.

(56) References Cited

U.S. PATENT DOCUMENTS

| | | | | |
|---|---|---|---|---|
| 6,671,335 B1 * | 12/2003 | Kim | ..................... | H03G 3/3089 375/340 |
| 8,006,163 B2 * | 8/2011 | Djordjevic | ........... | H03M 13/116 714/751 |
| 8,161,357 B2 * | 4/2012 | Tan | ................... | H03M 13/2957 714/751 |
| 8,381,065 B2 * | 2/2013 | Djordjevic | .......... | H03M 13/033 714/755 |

(Continued)

FOREIGN PATENT DOCUMENTS

EP  1696786 B1  1/2013
WO  2007/068554 A1  6/2007

OTHER PUBLICATIONS

Berrou's Near Shannon Limit Error, ICC, Switzerland, pp. 1064-1070, May 1993 (7 pages).

(Continued)

*Primary Examiner* — Esaw T Abraham
(74) *Attorney, Agent, or Firm* — Workman Nydegger (57) ABSTRACT

Iterative signal processing. At communication hardware, a signal is received from a transmission medium. The signal has characteristics that obscure data or a signal of interest in the signal. The signal is processed at a first signal processor, which is an iterative processor that performs signal processing in cycles whereby successive cycles: improve the performance of processing of the processor itself over previous cycles, or improve the output from the processor. The signal is processed at one or more second signal processors. Extrinsic data, with respect to the first signal processor is (Continued)

produced as a result. The extrinsic data is provided to the first signal processor and used to counter the effects of the data or signal of interest being obscured in the signal, while the first signal processor is intracycle of a first processing cycle.

20 Claims, 4 Drawing Sheets (56) References Cited

U.S. PATENT DOCUMENTS

| | | | | |
|---|---|---|---|---|
| 8,458,555 | B2* | 6/2013 | Gunnam | H03M 13/1108 714/752 |
| 8,683,299 | B2* | 3/2014 | Gunnam | H03M 13/3707 714/774 |
| 9,246,717 | B2* | 1/2016 | Beidas | H04L 25/03286 |
| 9,537,513 | B2* | 1/2017 | Bisplinghoff | H03M 13/258 |
| 9,553,743 | B2* | 1/2017 | Shen | H04L 25/066 |
| 2005/0138520 | A1 | 6/2005 | Richardson | |
| 2019/0036593 | A1 | 1/2019 | Pasternak et al. | |

OTHER PUBLICATIONS

Colavolpe's Algorithms for Iterative Decoding in the Presence of Strong Phase Noise, IEEE, vol. 23 No. 9, Sep. 2005 (10 pages).

Singer's Turbo Equalization, IEEE, Jan. 2004 (14 pages).

Barbieri et al., "On pilot-symbol-assisted carrier synchronization for DVB-S2 systems", IEEE Transactions on Broadcasting, vol. 53, Issue: 3, Sep. 2007, pp. 685-692.

European Search Report received for EP Patent Application No. 22205950.3, dated Feb. 7, 2023, 18 pages.

Lee et al., "Scheduling for an Adaptive No. of Iterations in Turbo Equalizers Combined with LDPC Decoders", IEEE Transactions on Communications, vol. 58, Issue: 10, Oct. 2010, pp. 2759-2764.

Zhang et al., "Shuffled iterative decoding", IEEE Transactions on Communications vol. 53, Issue 2, Feb. 2005, pp. 209-213.

* cited by examiner

PARTIAL UPDATE SHARING IN JOINT LDPC DECODING AND ANCILLARY PROCESSORS

BACKGROUND

Background and Relevant Art

Numerous different devices can be equipped with systems for transmitting and/or receiving communications. These communications may be transmitted to, or received from, any number of different external targets, endpoints, network nodes, or systems. As an example, communications can be sent and received by walkie-talkies, cell phones, vehicles, airplanes, rotary aircraft, ships, satellites, wired communication nodes, fiber-optic communication nodes, acoustic communication nodes, hard disk or flash storage drives, and so on.

Devices with communication capabilities are able to establish different communication links with external transmitters and receivers. Because of the benefits provided by various communications systems, more and more components are being installed into electronic devices.

With the proliferation of new communications systems, there is a substantial incentive to continuously improve such communications systems. To accomplish communication improvements, systems implement various signal processors to counter the obscuring effects of noise, occlusions, intentional jamming, signal phase issues, intersymbol interference caused by multipath propagation or frequency response characteristics of a channel, etc. Many of these signal processors are iterative signal processors which perform processing in iterative cycles. These processors are implemented such that successive cycles of a given signal processor improve the performance of processing of the processor itself over previous cycles. This can be accomplished, for example, by using information from the previous cycles and/or using information from other processors produced at the end of cycles of those other processors. Alternatively, or additionally, these processors are implemented such that successive cycles of a given signal processor improve the output from the processor using information from the previous cycles and/or information from other processors at the end of cycles of those other processors.

Such processors may include, for example, forward error correction (FEC) processors, such as low-density parity check (LDPC) processors. In FEC protected systems, the transmitter processes a message containing information and creates an encoded message with properties that allow a receiver to correct corruptions or deletions caused by the channel. For LDPC and some other FEC schemes, decoding in the receiver is performed by an iterative processor. Additionally, other iterative processors can be implemented.

Information can be shared between various iterative processors. In particular, information is passed back and forth at the end of each cycle. Information produced by one iterative processor may be useful in the operations of another iterative processor. For example, ancillary processors can process information from an LDPC decoder and provide updates, produced at the end of processing, back to the LDPC decoder. These updates can facilitate the decoding process in subsequent iterations. Thus, after each iteration or at the conclusion of decoding, information can be exchanged between processors.

Currently, iterative processors take turns running so as to be able to provide information back and forth at the end of each cycle. This may cause one processor to sit idle while processing in a different processor occurs. Many processors update much more slowly than other processors. For example, a CBC processor requires serial forward and backward recursions and thus updates more slowly than a typical LDPC decoder. For an existing Digital Video Broadcasting—Satellite—Second Generation (DVB-S2) LDPC decoder coupled with a CBC algorithm implementation, the LDPC decoder throughput drops between 50% to 90%, as compared to when only the LDPC decoder is used, because it waits for the serial CBC algorithm to complete after each iteration.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a method of performing iterative signal processing. The method includes communication hardware, receiving a signal from a transmission medium. The signal has characteristics that obscure data or a signal of interest in the signal. The signal is processed at a first signal processor. The first signal processor is an iterative processor that performs signal processing in cycles whereby successive cycles: improve the performance of processing of the processor itself over previous cycles, using information from the previous cycles, or information from other processors; or improve the output from the processor using information from the previous cycles or information from other processors. The signal is processed at one or more second signal processors. The one or more second signal processors are also iterative processors. Extrinsic data, with respect to the first signal processor, is produced as a result of processing the signal at the one or more second signal processors. The extrinsic data is provided to the first signal processor while the first signal processor is intracycle (i.e., during an iteration) of a first processing cycle. At the first signal processor, intracycle to the first processing cycle, the extrinsic data from the one or more second signal processors is used to counter the effects of the data or signal of interest being obscured in the signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein can significantly improve signal processing by allowing iterative processors to send and receive data to each other in an intracycle fashion. That is, in embodiments illustrated herein, an iterative processor can now provide information as soon as it is produced irrespective of whether a cycle has completed or not. Similarly, an iterative processor can receive and apply extrinsic data midcycle. That is, extrinsic data can be applied as it is received, during an executing cycle, without needing to wait until the cycle has completed. As used herein, extrinsic data is new information provided from a source external to the processor to which it is provided. For example, extrinsic data may be data provided to a processor that is not produced as a result of processing internal to the processor. While data of the same value can be produced by the processor itself, extrinsic data is data of the value, provided from an external source.

Previously, as illustrated above, various iterative processors would need to wait until the end of a cycle to provide data and/or would need to wait until the start of a new cycle to use provided data.

Figure 1:
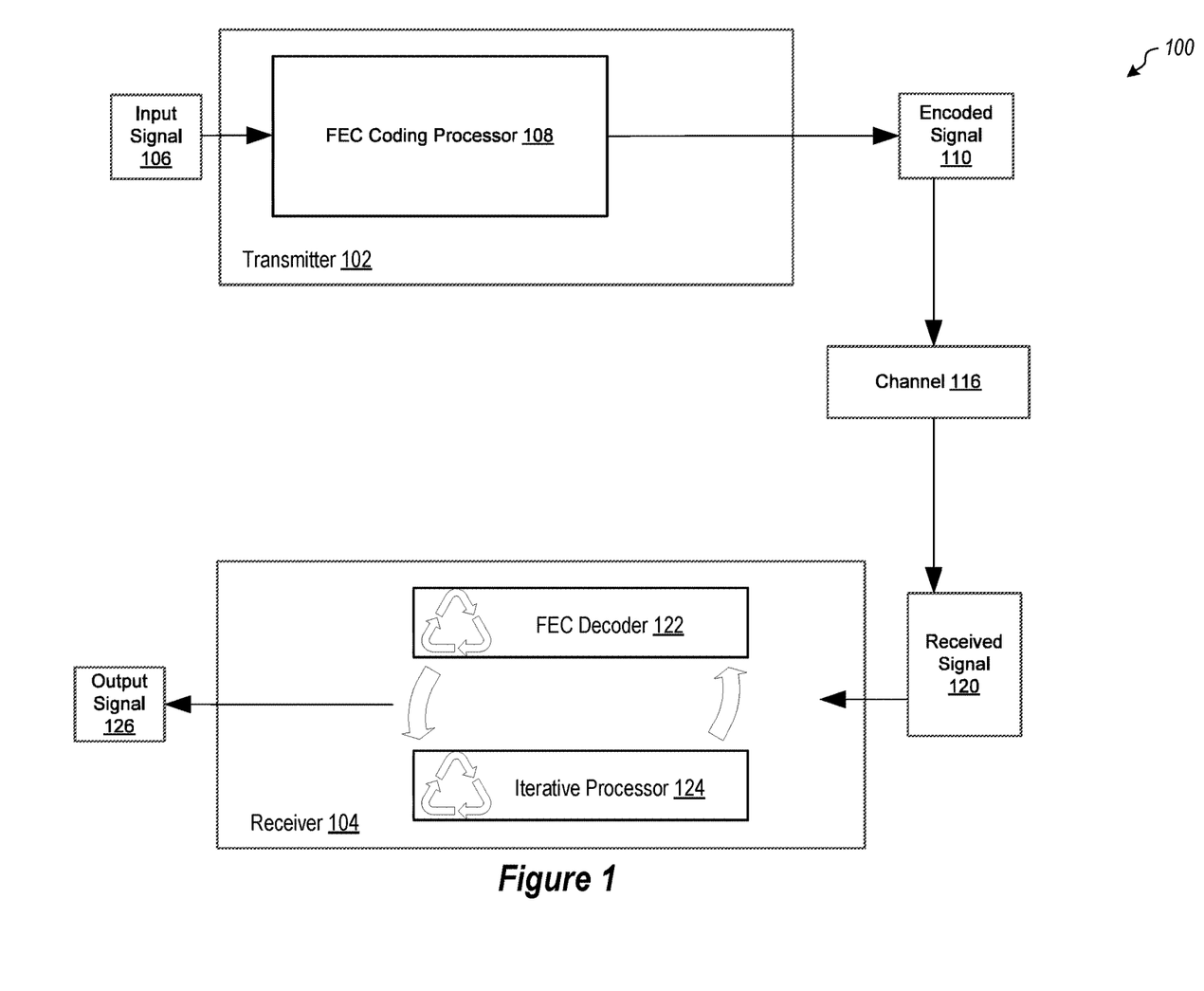
FIG. 1 illustrates a communication system including a transmitter and receiver, where iterative processors are used, and in particular where iterative processors share information.

An example is now illustrated. Referring now to FIG. 1, a communication system 100 is illustrated. The communication system 100 includes a transmitter 102 and a receiver 104. In this example, the transmitter 102 will send data to the receiver 104. It should be appreciated however that nodes in the communication system 100 will often have both transmitter and receiver capabilities, and thus can accomplish bidirectional communication. However, in the illustrated example, nodes are illustrated as exclusively a transmitter 102 or a receiver 104 for simplicity in understanding the concepts illustrated herein.

In the example illustrated in FIG. 1, an input signal 106 is input into an FEC coding processor 108 at the transmitter 102. For example, the input signal 106 may be a number of data bits which are intended to be transmitted to the receiver 104 for use at various systems at the receiver 104. Note that while bits are used in the illustrated example, it should be appreciated that other symbols may be additionally or alternatively used. To transmit the data bits in the input signal 106 to the receiver 104 various signal processing operations are performed to facilitate and/or improve transmission of the data in the input signal 106. For example, the data in the input signal 106 cannot simply be transmitted to the receiver 104 without first embedding the data in some kind of transmission signal such as an RF signal, optical signal, or other signal appropriate for an appropriate transmission medium. Thus, the transmitter 102 includes various digital to analog converters to convert the bits in the input signal 106 to appropriate analog signals. The transmitter 102 further includes various amplifiers to amplify analog signals to an appropriate signal strength. The transmitter 102 includes various modulators to modulate the analog signals onto transmission signals for transmission on the channel 116 to the receiver 104. Further, the transmitter 102 includes various transmission lines for providing various intermediate signals to various signal processing components at the transmitter 102.

As discussed previously, as a signal is transmitted over the channel 116, the channel may affect the signal in negative ways. For example, interfering signals may interfere with the signal transmitted over the channel 116. This interference may be intentional or unintentional. For example, intentional interference may be transmitted by jammers used by nefarious entities that are attempting to disrupt the communication between the transmitter 102 and the receiver 104. Alternatively, or additionally, other interference, such as interference from other signal transmitting entities, other transmissions from the transmitter 102 itself or other related transmitters (e.g., co-site interference), cosmic radiation interference, or other signals may interfere with the signal transmitted over the channel 116. Alternatively, or additionally, the signal transmitted over the channel 116 may be blocked by occlusions or other elements. For example, if the channel 116 is an over the air channel, buildings, aircraft, clouds, mountains, or other occlusions can block or attenuate the signal transmitted over the channel 116. Alternatively, or additionally, transmission of the signal on the channel 116 may be performed in such a fashion that the signal is transmitted to the receiver 104 and is subject to multipath. For example, portions of the signal may travel in a straight-line fashion from the transmitter 102 to the receiver 104 while portions of the signal simultaneously travel in a fashion where the signal is reflected off buildings, aircraft, mountains, bodies of water, the stratosphere, or other items. This results in different components of the signal reaching the receiver 104 at different times. Alternatively, or additionally, the channel 116 may have various frequency response characteristics that cause certain frequencies that make up the signal to be transmitted at different speeds than other frequencies that make up the signal. This causes symbols in the signal to spread causing intersymbol interference whereby symbols interfere with each other. All of the various items discussed above can result in recovery of the signal at the receiver 104 being more difficult as data modulated onto a communication signal may become missing and/or ambiguous.

Thus, some embodiments illustrated herein include functionality for improving the signal sent to the receiver 104 to include certain features which allow for detection and recovery of missing and/or ambiguous elements. In particular, FIG. 1 illustrates the FEC coding processor 108. The FEC coding processor 108 creates a code word comprising data bits from the input signal 106 and parity bits, according to a particular error correction scheme, interleaved and formed into the code word transmitted in the encoded signal 110. That is, the encoded signal 110 includes a codeword based on redundant information or parity bits in addition to the bits from the input signal 106 which allows for recovery of bits that are lost or made ambiguous as a result of transmission through the channel 116 and/or as the result of other interference. Note that while the codeword may include a separation between the original information bits and parity bits, this is not always the case.

FIG. 1 illustrates a received signal 120 that is received by the receiver 104. The received signal 120 obscures data or a signal of interest due to all of the effects of the channel 116 which can be defined to include other external actors on the encoded signal 110. The receiver 104 includes various processors. Some of these processors can be specially configured for counteracting the effects of the channel 116 or other actors on the encoded signal 110. In particular, FIG. 1 illustrates an FEC decoder 122, the FEC decoder 122 is able to identify when errors have occurred in the received signal 120 to obscure data and to correct such errors.

FIG. 1 further illustrates an additional ancillary iterative processor 124. The additional ancillary iterative processor 124 may perform any one of a number of different functions to process the received signal 120 or signals derived therefrom.

As a preliminary matter to discussing the FEC decoder 122 and the iterative processor 124, it should be appreciated that the receiver 104 includes various hardware elements such as antennas for receiving the received signal, transmission lines for transporting the received signal 120 to different locations at the receiver 104, various amplifiers, demodulators, and other communication circuits as appropriate.

The FEC decoder 122 is a counterpart of the FEC coding processor 108 and is able to perform various functions as discussed previously herein to use the encoded data bits from the input signal 106 as well as the additional check bits to detect and correct errors in the encoded received signal 120. For example, one example of an FEC decoder is an LDPC decoder. Many modern FEC decoders are iterative in nature. For example, in some embodiments the received signal 120 may have several missing bits and/or ambiguities. Some embodiments of FEC decoders attempt to recover these missing bits by iterative processing in a way that, ideally, allows received information to converge to correct values. Thus, for a given codeword, the FEC decoder 122 may perform several cycles to attempt to correct errors in the received signal 120.

Similarly, the iterative processor 124 is an ancillary iterative processor that may be used to perform other signal processing on the received signal 120 or signals derived therefrom. For example, in some embodiments the iterative processor 124 may be an equalizer configured to perform equalization of signals transmitted in one or more multipath channels. Alternatively, or additionally, the iterative processor 124 may be a phase noise correcting processor. Alternatively, or additionally, the iterative processor 124 may be a cross-polarization interference canceller configured to iteratively cancel signals cross-coupled onto the polarization of the signal of interest. Alternatively, or additionally, the iterative processor 124 may be a turbo decoder for concatenated convolutional codes which implements iterative error correcting codes.

Embodiments illustrated herein perform continuous sharing of partial update information between iterative processors, such as the FEC decoder 122 and the iterative processor 124 for more efficient joint decoding and ancillary processing. It is worth noting at this point that although an FEC decoder and another ancillary processor are shown, it should be appreciated that some embodiments do not require one of the processors to be an FEC decoder. This is, various combinations of iterative processors may be used, without limitation as to the type of iterative processors, other than that the iterative processors are able to share information and/or use the shared information.

The following illustrates now additional details about how using extrinsic data intracycle can be useful for improving receiver hardware functionality.

Consider the case of an LDPC decoder. An LDPC decoder receives as input a plurality of bits corrupted in the channel, such that isolated bit-wise detection would result in one or more mis-detections. Iterative processing is performed to increase the number of bits that are correctly detected. In some embodiments, more parity relationships are satisfied in each cycle. If all parity relationships can be satisfied in a cycle, using extrinsic data provided from a different iterative processor in the receiver 104, iteration steps can be eliminated via early termination.

Alternatively, or additionally, LDPC decoders use probabilities in the form of log-likelihood ratios (LLRs) to characterize channels and make decoding decisions. Extrinsic data from other iterative processors can provide LLRs directly or can be used to update LLRs that are used in an LDPC decoder to make decoding decisions. This can eliminate processing needed to determine LLRs or to update LLRs in cycles, thus reducing the processing needed for a given cycle and/or reducing the number of cycles that need to be performed.

In another example, an iterative processor may be an equalizer. Equalizers may be used, for example, to reverse distortion. Some equalizers are configured to shift signal phases. Using extrinsic data, phase shifts can be performed more quickly, either by shortening cycles or by reducing the number of cycles that need to be performed to achieve a particular desired phase shift.

In another example, an iterative processor may be an adaptive filter. An adaptive filter has filter coefficients that can be updated. Thus, in some embodiments, these coefficients can be updated intracycle, using extrinsic information obtained from other iterative processors, resulting in reduced processing in a particular cycle, or the need for fewer cycles.

In another example, an iterative processor may use error signals identifying an error magnitude. Thus, in some embodiments, error magnitude can be updated intracycle, using extrinsic information obtained from other iterative processors, resulting in reduced processing in a particular cycle, or the need for fewer cycles.

In another example, an iterative processor may use channel state information. Thus, in some embodiments, channel state information can be updated intracycle, using extrinsic information obtained from other iterative processors, resulting in reduced processing in a particular cycle, or the need for fewer cycles.

As illustrated above, embodiments are implemented whereby iterative processors can share information that is available from the iterative processes as soon as it is available, or at least prior to a cycle in which the information is produced is completed. Further, other iterative processors can use provided information (i.e., extrinsic data) as soon as it is provided, or at least intracycle to when it is provided. Previously, sending and applying extrinsic data occurred only at iteration boundaries or after decoding had terminated. Embodiments can increase the performance and efficiency of all iterative processors involved. For example, in the example illustrated in FIG. 1, performance and efficiency of both the FEC decoder 122 and ancillary iterative processor 124 are increased.

Previously, iterative processors, such as an FEC decoder and ancillary processor would take turns running. In the example illustrated in FIG. 1, the FEC decoder 122 and the iterative processor 124 are both able to run continuously. In some embodiments, the embodiments collect messages already being exchanged in the FEC decoder 122 to update the ancillary iterative processor 124. The results are inserted into the FEC decoder data stream without disturbing it.

For example, the FEC decoder 122 may continuously run and provide continuous updates to another processor, such as the iterative processor 124, or a non-iterative processor (not shown). The other processor(s) 124 uses decoder-provided information as it comes and provides updates back to the FEC decoder 122 after that processor 124 has completed its processing. An example of this may include LDPC decoding and algebraic decoding of a concatenated BCH code.

In another example, the FEC decoder 122 and ancillary processor(s) 124 share information continuously to implement an improved form of turbo equalization.

Embodiments improve previous systems in that if updates are made incrementally or periodically between the processors and the decoder continues to run, the decoder throughput does not decrease as compared to when processors must complete processing before data can be provided to another processor or new extrinsic data can be applied.

Using the iterative processors 122 and 124, an output signal 126 is produced. Typically, the goal is that the output signal 126 is as close as possible to the input signal 106. As noted, this can be accomplished by using the iterative processors 122 and 124 to recover data, compensate for channel effects, and/or perform other actions to recover data.

Figure 2:
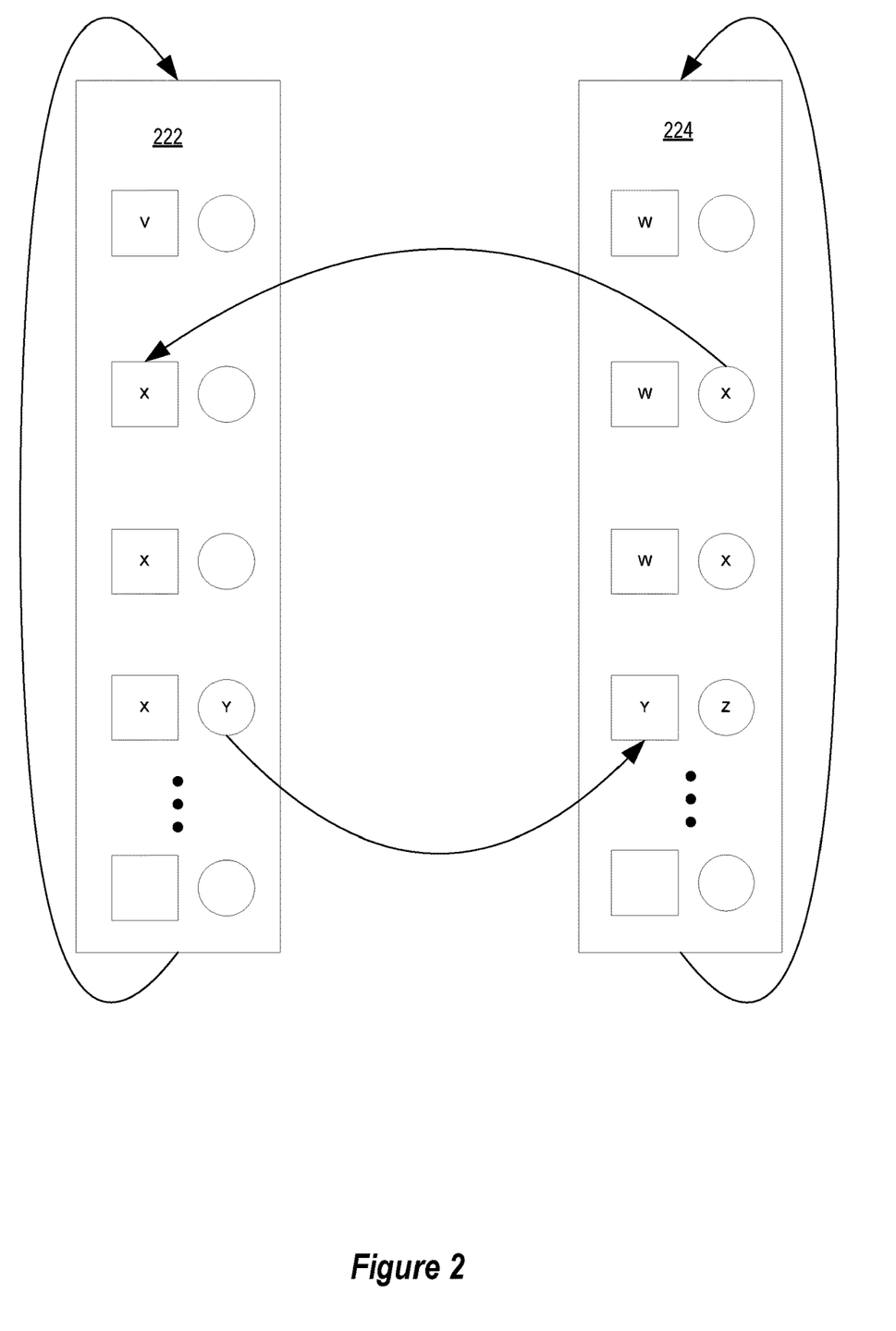
FIG. 2 illustrates one example of interaction between iterative processors.

Referring now to FIG. 2, additional details are illustrated. FIG. 2 illustrates a first iterative processor 222 and a second iterative processor 224. FIG. 2 illustrates two types of data with respect to the processors. In particular, data illustrated by squares is input data with respect to the processor to which it belongs, while data illustrated by circles is output data produced as a result of processing by the processor to which the circle belongs. Further, FIG. 2 illustrates processing of a single cycle by each of the processors 222 and 224. In the example illustrated in FIG. 2, the cycles for each of the processors 222 in 224 are running simultaneously (although not necessarily with coordinated cycles) with each other. In the example illustrated in FIG. 2, examples of producing data and providing the data to another processor as extrinsic data with respect to that other processor, intracycle to a process being performed by the other processor, are illustrated.

In particular, FIG. 2 illustrates the first iterative processor 222 having as input the value 'v'. With respect to the second iterative processor 224, the second processor 224 has as input the value 'w'. In the second processor 224, the input value 'w' causes an output value of 'x' to be produced. As illustrated in FIG. 2, this particular value of 'x' can be substituted for the input value 'v' as extrinsic data provided to the first iterative processor 222. Note that the extrinsic data having a value of 'x' is provided from the second iterative processor 224 to the first iterative processor 222 intracycle to both the process being performed at the first iterative processor 222 in the second iterative processor 224.

As illustrated in FIG. 2, processing continues at the first iterative processor 222 until eventually the input value 'x' produces an output value of 'y'. In this example, the output value of 'y' happens to be a data value that may be of use to the second iterative processor 224, and represents a more accurate value than the value 'w' currently being used by the second iterative processor 224. Thus, the value 'y' can be provided as extrinsic data to the second iterative processor 224 and can be used to replace the data of value 'w'. As illustrated in FIG. 2, this likewise causes a change in the output of processing of the second iterative processor 224 resulting in an output value of data having a value of 'z'.

Illustratively, by providing and receiving data intracycle, more accurate results can be obtained faster, either by performing less processing during a given cycle and/or by performing fewer cycles. Note that the example in FIG. 2 illustrates an example where data produced in one iterative processor and provided as extrinsic data to another iterative processor is substituted for existing inputs at the other processor to resolve to more correct outputs in the other iterative processor more quickly.

Figure 3:
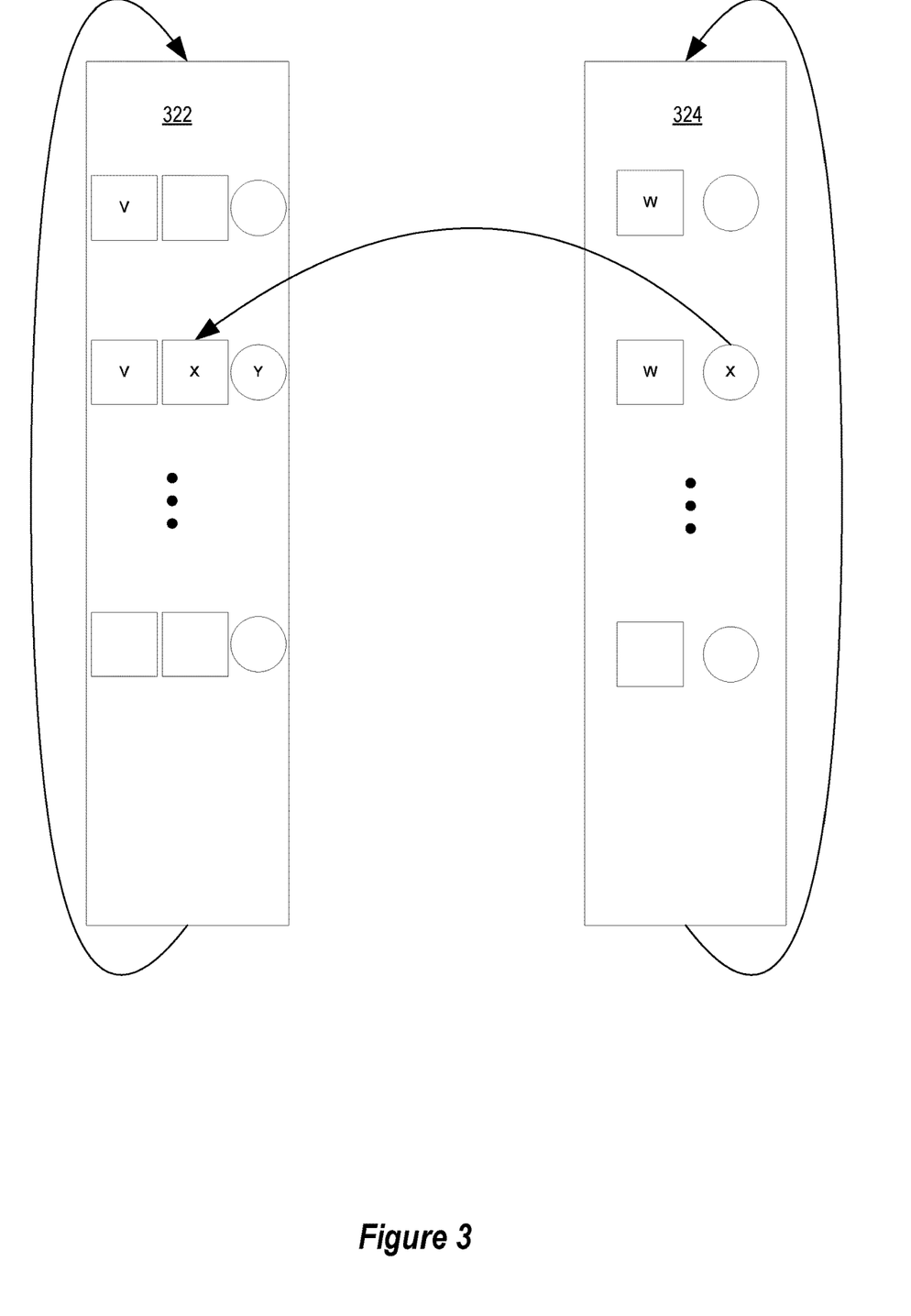
FIG. 3 illustrates another example of interaction between iterative processors.

However, as will be illustrated in FIG. 3, in some embodiments, data produced at one iterative processor can be provided to another iterative processor, as extrinsic data, and used as additional data or original data without needing to exchange the provided data for other input data already existing at the other iterative processor. For example, FIG. 3 illustrates a first iterative processor 322 and a second iterative processor 324. In this example, processing at the second iterative processor produces an output value of 'x'. The output value of 'x' is provided to the first iterative processor 322 as additional data that can be used along with existing input data of value 'v' to produce the output data 'y'. For example, some embodiments may implement iterative processors that allow multiple inputs and/or allow for aggregation of inputs during processing. Thus, rather than a full substitution of an input as illustrated in FIG. 2, additional information can be used to refine outputs. Note that as with the example illustrated in FIG. 2, the data of value 'x' is produced intracycle of the cycle being performed by the second iterative processor 324, and is provided as extrinsic data intracycle to the first iterative processor 322 and is applied in the processes being performed in that cycle by the first iterative processor 322.

Note that while FIGS. 2 and 3 illustrate iterative processing in one direction, it should be appreciated that the processing can be both directions. For example, in some embodiments, processors may implement serial forward and backward recursions.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed. Further, acts may be repeated, including any waiting for data on which a particular act may depend.

Figure 4:
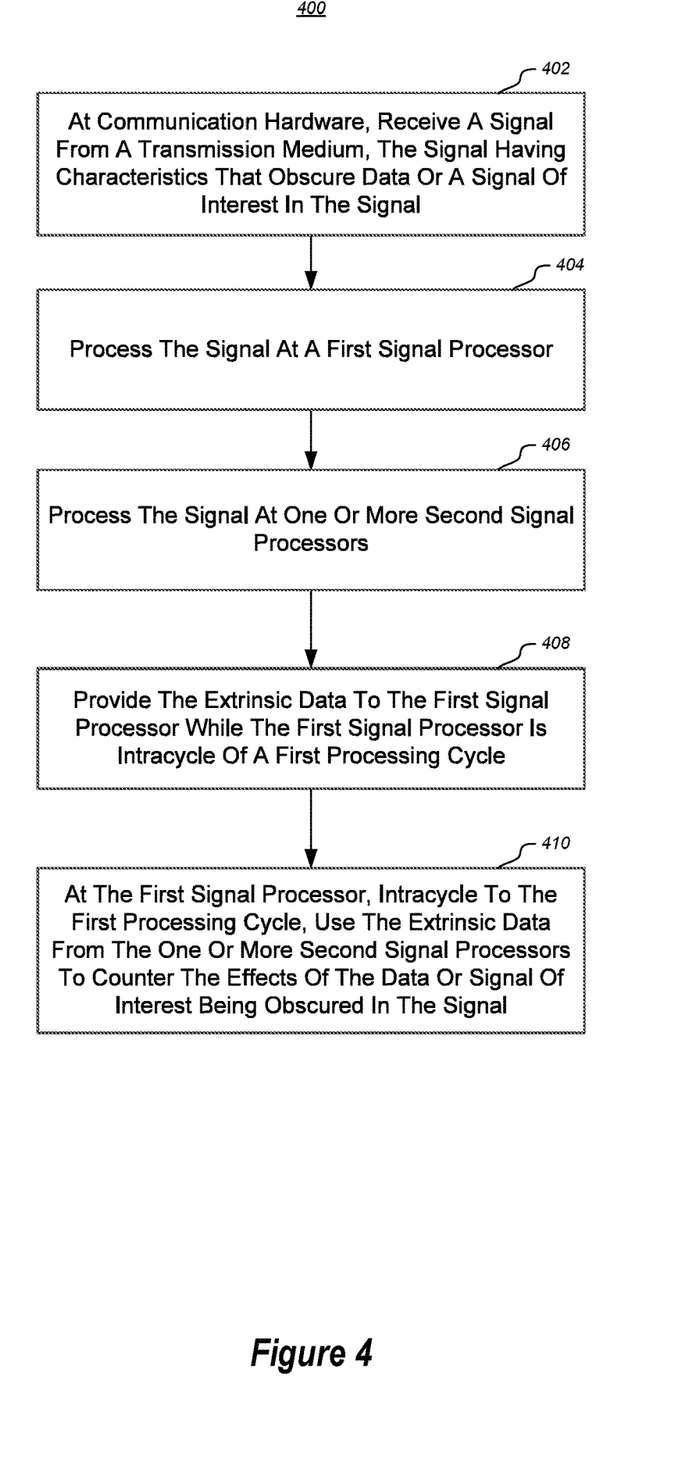
FIG. 4 illustrates a method of performing iterative processing.

Referring now to FIG. 4, a method 400 is illustrated. The method 400 includes acts for performing iterative signal processing. The method includes communication hardware, receiving a signal from a transmission medium, the signal having characteristics that obscure data or a signal of interest in the signal (act 402). For example, a signal, such as signal 120 may be received over the air, from a circuit board, or from other transmissions lines.

The method 400 further includes processing the signal at a first signal processor (act 404). The first signal processor is an iterative processor that performs signal processing in cycles. In particular, successive cycles improve the performance of processing of the processor itself over previous cycles, using information from the previous cycles, or information from other processors hosting actions such as act 406—which may run concurrently to 404. Alternatively, successive cycles improve the output from the processor using information from the previous cycles or information from other processors hosting actions such as 406, which may run concurrently to 404. In the examples illustrated above, the FEC decoder 122 may be an example of a first signal processor.

The method 400 further includes processing the signal at one or more second signal processors (act 406). The one or more second signal processors are iterative processors. Extrinsic data, with respect to the first signal processor, is produced as a result of processing the signal at the one or more second signal processors.

The method 400 further includes providing the extrinsic data to the first signal processor while the first signal processor is intracycle of a first processing cycle (act 408). Examples of this are illustrated in FIGS. 2 and 3. For example, FIG. 2 illustrates the processor 224 providing extrinsic data 'x' intracycle to the cycle being performed by the processor 222.

The method 400 further includes, at the first signal processor, intracycle to the first processing cycle, using the extrinsic data from the one or more second signal processors to counter the effects of the data or signal of interest being obscured in the signal (act 410). Examples of this are illustrated in FIGS. 2 and 3. For example, FIG. 2 illustrates the processor 222 uses the extrinsic data intracycle of the cycle being performed by the processor 222.

The method 400 may be practiced where the extrinsic data from the one or more second signal processors is produced and provided to the first signal processor intracycle to a cycle at at least one of the one or more second signal processors. Thus for example, in FIG. 2, 'x' is provided to the processor 222 intracycle of a cycle being performed by the processor 224.

The method 400 may be practiced where the first signal processor comprises an LDPC decoder and the one or more second signal processors comprise at least one of a BCH decoder, a CBC processor, an adaptive equalizer, or a cross polarization interference canceller.

The method 400 may further include providing extrinsic data produced intracycle of the first processing cycle at the first signal processor to the one or more second signal processors and at the one or more second signal processors intracycle to a second processing cycle, substituting the extrinsic data produced intracycle of the first processing cycle for other extrinsic data that was used previously in the second processing cycle to counter the effects of the data or signal of interest being obscured in the signal. That is, just as extrinsic data can be provided intracycle by the second signal processor to the first signal processor, so too can data be provided by the first signal processor to the second signal processor.

The method 400 may be practiced where using the extrinsic data from the one or more second signal processors comprises substituting the extrinsic data from the one or more second signal processors for other data that was used previously in the first processing cycle to counter the effects of the data or signal of interest being obscured in the signal. An example of this is illustrated in FIG. 2, where 'x' is substituted for 'v'. Note that in some embodiments, the other data is other extrinsic data received from other processors. Thus, for example, in the example shown in FIG. 2, 'v' may be extrinsic data previously provided from an iterative processor other than processor 222. Alternatively, in some embodiments, the other data is intrinsic data produced by the first signal processor. Thus, for example, in the example shown in FIG. 2, 'v' may have been produced locally at the processor 222.

The method 400 may be practiced where using the extrinsic data from the one or more second signal processors comprises using the extrinsic data from the one or more second signal processors to supplement other data that was previously in the first processing cycle. An example of this is illustrated in FIG. 3, where 'x' supplements 'v'. In one embodiment, the extrinsic data is a probability for a decision for one or more bits and the other data is a probability for a decision for the same one or more bits. Thus, for example, this data may be used for a soft decision using a log likelihood ratio.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of performing iterative signal processing, the method comprising:
    at communication hardware, receiving a signal from a transmission medium, the signal having characteristics that obscure data or a signal of interest in the signal;
    processing the signal at a first signal processor, the first signal processor being an iterative processor that performs signal processing in cycles whereby successive cycles are implemented to perform one or more of the following:
        increase a number of bits that are correctly detected as compared to previous cycles;
        update log-likelihood ratios from previous cycles;
        shorten cycles used to perform signal phases shifts as compared to previous cycles;
        reduce the number of cycles that need to be performed to achieve a desired phase shift as compared to previous cycles;
        update adaptive filter coefficients as compared to previous cycles;
        update error magnitude as compared to previous cycles; or
        update channel state information as compared to previous cycles;
    processing the signal at one or more second signal processors, the one or more second signal processors being iterative processors, wherein extrinsic data, with respect to the first signal processor, is produced as a result of processing the signal at the one or more second signal processors;
    providing the extrinsic data to the first signal processor while the first signal processor is performing a first processing cycle; and
    at the first signal processor, during the first processing cycle, using the extrinsic data from the one or more second signal processors to counter effects of the data or signal of interest being obscured in the signal.

2. The method of claim 1, wherein the extrinsic data from the one or more second signal processors is produced and provided to the first signal processor during a cycle at at least one of the one or more second signal processors.

3. The method of claim 1, wherein the first signal processor comprises an LDPC decoder and the one or more second signal processors comprise at least one of a BCH decoder, a CBC processor, an adaptive equalizer, or a cross polarization interference canceller.

4. The method of claim 1, further comprising:
    providing extrinsic data produced performing the first processing cycle at the first signal processor to the one or more second signal processors; and
    at the one or more second signal processors during a second processing cycle, substituting the extrinsic data produced performing the first processing cycle for other extrinsic data that was used previously in the second processing cycle to counter the effects of the data or signal of interest being obscured in the signal.

5. The method of claim 1, wherein using the extrinsic data from the one or more second signal processors comprises substituting the extrinsic data from the one or more second signal processors for other data that was used previously in the first processing cycle to counter the effects of the data or signal of interest being obscured in the signal.

6. The method of claim 5, wherein the other data is other extrinsic data received from other processors.

7. The method of claim 5, wherein the other data is intrinsic data produced by the first signal processor.

8. The method of claim 1, wherein using the extrinsic data from the one or more second signal processors comprises using the extrinsic data from the one or more second signal processors to supplement other data that was previously in the first processing cycle.

9. The method of claim 8, wherein the extrinsic data is a probability for a decision for one or more bits and the other data is a probability for a decision for the same one or more bits.

10. A computer system comprising:
    one or more processors; and
    one or more physical computer-readable media having stored thereon instructions that are executable by the one or more processors to configure the computer system to perform iterative signal processing, including instructions that are executable to configure the computer system to perform at least the following:

at communication hardware, receiving a signal from a transmission medium, the signal having characteristics that obscure data or a signal of interest in the signal;

processing the signal at a first signal processor, the first signal processor being an iterative processor that performs signal processing in cycles whereby successive cycles are implemented to perform one or more of the following:

increase a number of bits that are correctly detected as compared to previous cycles;

update log-likelihood ratios from previous cycles;

shorten cycles used to perform signal phases shifts as compared to previous cycles;

reduce the number of cycles that need to be performed to achieve a desired phase shift as compared to previous cycles;

update adaptive filter coefficients as compared to previous cycles;

update error magnitude as compared to previous cycles; or update channel state information as compared to previous cycles;

processing the signal at one or more second signal processors, the one or more second signal processors being iterative processors, wherein extrinsic data, with respect to the first signal processor, is produced as a result of processing the signal at the one or more second signal processors;

providing the extrinsic data to the first signal processor while the first signal processor is performing a first processing cycle; and at the first signal processor, during the first processing cycle, using the extrinsic data from the one or more second signal processors to counter effects of the data or signal of interest being obscured in the signal.

11. The computer system of claim 10, wherein the extrinsic data from the one or more second signal processors is produced and provided to the first signal processor during a cycle at at least one of the one or more second signal processor.

12. The computer system of claim 10, wherein the first signal processor comprises an LDPC decoder and the one or more second signal processors comprise at least one of a BCH decoder, a CBC processor, an adaptive equalizer, or a cross polarization interference canceller.

13. The computer system of claim 10, wherein the one or more computer-readable media further have stored thereon instructions that are executable by the one or more processors to configure the computer system to perform the following:

providing extrinsic data produced performing the first processing cycle at the first signal processor to the one or more second signal processors; and at the one or more second signal processors during a second processing cycle, substituting the extrinsic data produced performing the first processing cycle for other extrinsic data that was used previously in the second processing cycle to counter the effects of the data or signal of interest being obscured in the signal.

14. The computer system of claim 10, wherein using the extrinsic data from the one or more second signal processors comprises substituting the extrinsic data from the one or more second signal processors for other data that was used previously in the first processing cycle to counter the effects of the data or signal of interest being obscured in the signal.

15. The computer system of claim 14, wherein the other data is other extrinsic data received from other processors.

16. The computer system of claim 14, wherein the other data is intrinsic data produced by the first signal processor.

17. The computer system of claim 10, wherein using the extrinsic data from the one or more second signal processors comprises using the extrinsic data from the one or more second signal processors to supplement other data that was previously in the first processing cycle.

18. The computer system of claim 17, wherein the extrinsic data is a probability for a decision for one or more bits and the other data is a probability for a decision for the same one or more bits.

19. A hardware receiver comprising:

communication hardware configured to receive a signal from a transmission medium, the signal having characteristics that obscure data or a signal of interest in the signal;

a first signal processor configured to process the signal, wherein the first signal processor is an iterative processor that performs signal processing in cycles whereby successive cycles perform one or more of the following:

increase a number of bits that are correctly detected as compared to previous cycles;

update log-likelihood ratios from previous cycles;

shorten cycles used to perform signal phases shifts as compared to previous cycles;

reduce the number of cycles that need to be performed to achieve a desired phase shift as compared to previous cycles;

update adaptive filter coefficients as compared to previous cycles;

update error magnitude as compared to previous cycles; or update channel state information as compared to previous cycles;

a second signal processor configured to process the signal, the second signal processor being an iterative processor, wherein the second signal processor is configured to produce extrinsic data, with respect to the first signal processor, as a result of processing the signal at the second signal processor, wherein the second signal processor is further configured to provide the extrinsic data to the first signal processor while the first signal processor is performing a first processing cycle; and wherein the first signal processor, during the first processing cycle, is configured to use the extrinsic data from the second signal processor to counter effects of the data or signal of interest being obscured in the signal.

20. The hardware receiver of claim 19, wherein the first signal processor comprises an LDPC decoder and the second signal processor comprises at least one of a BCH decoder, a CBC processor, an adaptive equalizer, or a cross polarization interference canceller.

* * * * *